(12) United States Patent
Sun et al.

(10) Patent No.: US 11,362,205 B2
(45) Date of Patent: Jun. 14, 2022

(54) GROUP III NITRIDE ENHANCEMENT-MODE HEMT BASED ON COMPOSITE BARRIER LAYER STRUCTURE AND MANUFACTURING METHOD THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Qian Sun, Suzhou (CN); Yu Zhou, Suzhou (CN); Yaozong Zhong, Suzhou (CN); Hongwei Gao, Suzhou (CN); Meixin Feng, Suzhou (CN); Hui Yang, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 0 days.

(21) Appl. No.: 16/960,322

(22) PCT Filed: Apr. 10, 2018

(86) PCT No.: PCT/CN2018/082576
§ 371 (c)(1),
(2) Date: Jul. 7, 2020

(87) PCT Pub. No.: WO2019/136864
PCT Pub. Date: Jul. 18, 2019

(65) Prior Publication Data
US 2021/0005739 A1 Jan. 7, 2021

(30) Foreign Application Priority Data
Jan. 12, 2018 (CN) .......................... 201810031021.8

(51) Int. Cl.
*H01L 29/66* (2006.01)
*H01L 29/778* (2006.01)
(Continued)

(52) U.S. Cl.
CPC ...... *H01L 29/7783* (2013.01); *H01L 29/2003* (2013.01); *H01L 29/205* (2013.01); *H01L 29/475* (2013.01); *H01L 29/66462* (2013.01)

(58) Field of Classification Search
CPC ........... H01L 29/2003; H01L 29/66462; H01L 29/7787; H01L 29/205; H01L 29/7783; H01L 29/7786
(Continued)

(56) References Cited

U.S. PATENT DOCUMENTS 6,064,082 A * 5/2000 Kawai ................. H01L 29/7783
257/191
7,038,252 B2 * 5/2006 Saito .................. H01L 29/1066
257/103
(Continued)

FOREIGN PATENT DOCUMENTS

CN 104916684 A 9/2015
CN 105651817 A 6/2016
(Continued)

OTHER PUBLICATIONS

Othman et al., "Design optimization of the graded AlGaN/GaN HEMT device performance based on material and physical dimensions," Microelectronics International (2019).*
(Continued)

*Primary Examiner* — Jay C Kim
(74) *Attorney, Agent, or Firm* — Baramoglu Law Offices LLC

(57) ABSTRACT

A group III nitride enhancement-mode HEMT based on a composite barrier layer structure and a manufacturing
(Continued)

method thereof are provided. The HEMT includes first and second semiconductors respectively serving as a channel layer and a barrier layer, a third semiconductor serving as a p-type layer, a source, a drain and a gate, wherein a recessed structure is formed in the region of the barrier layer corresponding to the gate, which is matched with the third semiconductor and the gate to form a p-type gate, and the second semiconductor includes first and second structure layers successively arranged on the first semiconductor; relative to the selected etching reagent, the first structure layer has higher etching resistance than the second structure layer.

8 Claims, 9 Drawing Sheets

(51) Int. Cl.
*H01L 29/20* (2006.01)
*H01L 29/205* (2006.01)
*H01L 29/47* (2006.01)

(58) Field of Classification Search
USPC .......................................................... 257/194
See application file for complete search history.

(56) References Cited

U.S. PATENT DOCUMENTS

| | | | | |
|---|---|---|---|---|
| 7,199,408 B2* | 4/2007 | Miyoshi | ............. | H01L 29/7787 257/280 |
| 7,470,941 B2* | 12/2008 | Micovic | ............ | H01L 21/28581 438/285 |
| 7,863,649 B2* | 1/2011 | Hikita | .................. | H01L 29/808 257/194 |
| 7,915,643 B2* | 3/2011 | Suh | ..................... | H01L 29/2003 257/194 |
| 8,076,685 B2* | 12/2011 | Tamura | ............. | H01L 21/30617 257/97 |
| 8,114,726 B2* | 2/2012 | Marui | ................. | H01L 29/7787 438/197 |
| 8,133,803 B2* | 3/2012 | Cheng | ............... | H01L 21/02658 438/507 |
| 8,193,562 B2* | 6/2012 | Suh | ..................... | H01L 29/2003 257/194 |
| 8,441,035 B2* | 5/2013 | Hikita | ................. | H01L 29/7786 257/192 |
| 8,643,025 B2* | 2/2014 | Nakayama | .......... | H01L 29/4236 257/76 |
| 8,680,580 B2* | 3/2014 | Ota | ................... | H01L 29/66462 257/195 |
| 8,698,198 B2* | 4/2014 | Kuraguchi | ........ | H01L 29/66462 257/190 |
| 8,809,869 B2* | 8/2014 | Shibata | ................. | H01L 29/452 257/76 |
| 8,853,742 B2* | 10/2014 | Yoshioka | .......... | H01L 29/66462 257/192 |
| 9,299,822 B2* | 3/2016 | Kikkawa | ........... | H01L 29/66462 |
| 9,335,262 B2* | 5/2016 | Wunderer | ........... | H01S 5/34333 |
| 9,537,066 B2* | 1/2017 | Kadowaki | ............... | H01L 33/58 |
| 9,543,424 B2* | 1/2017 | Derluyn | .............. | H01L 29/7786 |
| 9,570,600 B2* | 2/2017 | Lu | ........................ | H01L 29/4236 |
| 9,577,084 B2* | 2/2017 | Hikita | ................... | H01L 29/205 |
| 9,666,702 B2* | 5/2017 | Kim | ...................... | H01L 29/2003 |
| 9,680,001 B2* | 6/2017 | Shibata | ............... | H01L 29/1033 |
| 9,837,496 B2* | 12/2017 | Kinoshita | ......... | H01L 29/66924 |
| 9,865,720 B2* | 1/2018 | Nakata | ................ | H01L 29/0843 |
| 10,109,727 B2* | 10/2018 | Oyama | ................. | H01L 29/778 |
| 10,453,926 B2* | 10/2019 | Kuraguchi | .......... | H01L 29/4236 |
| 10,529,841 B2* | 1/2020 | Kajitani | .......... | H01L 29/66462 |
| 2017/0110598 A1* | 4/2017 | Chen | ................. | H01L 29/66143 |
| 2017/0338122 A1* | 11/2017 | Daulton | ............ | H01J 37/32357 |
| 2017/0345921 A1* | 11/2017 | Feng | ................... | H01L 29/7786 |
| 2019/0288101 A1* | 9/2019 | Longobardi | ........ | H01L 29/0619 |

FOREIGN PATENT DOCUMENTS

| | | |
|---|---|---|
| CN | 105655395 A | 6/2016 |
| CN | 107093628 A | 8/2017 |

OTHER PUBLICATIONS

Ma et al., "Growth and Characterization of AlGaN/AlN/GaN HEMT structures with a Compositionally Step-Graded AlGaN Barrier Layer," Chinese Physics Letters 24 (2007) pp. 1705-1708.*

* cited by examiner

GROUP III NITRIDE ENHANCEMENT-MODE HEMT BASED ON COMPOSITE BARRIER LAYER STRUCTURE AND MANUFACTURING METHOD THEREOF

CROSS REFERENCE TO THE RELATED APPLICATIONS

This application is the national phase entry of International Application No. PCT/CN2018/082576, filed on Apr. 10, 2018, which is based upon and claims priority to Chinese Patent Application No. 201810031021.8, filed on Jan. 12, 2018, the entire contents of which are incorporated herein by reference.

TECHNICAL FIELD

The disclosure relates to a field-effect transistor device, and particularly to a group III nitride enhancement-mode HEMT based on a composite barrier layer structure and a manufacturing method thereof, belonging to the technical field of semiconductors.

BACKGROUND

Compared with the traditional silicon-based MOSFET, a high-electron-mobility transistor (HEMT) based on heterojunctions such as AGaN/AlN/GaN has unique advantages of low on-resistance, high breakdown voltage, high switching frequency and the like, and therefore can be used in various power conversion systems as a core device and has important application prospect in the aspect of energy conservation and consumption, thus having received tremendous attention from academia and industry. However, due to the polarization effect of the group III nitride material system, generally, HEMTs based on AGaN/AlN/GaN heterojunctions are all of depletion-mode (normally-on), and this type of devices need to design a negative polarity gategate drive circuit when being applied to a circuit to realize the on-off switch of the device, which greatly increases the complexity and cost of the circuit. In addition, the depletion-mode devices have the problem of failure security capability, and thus cannot truly realize commercial application. In order to solve this problem, preparation of enhancement-mode HEMT based on a p-type gate technology is a feasible solution, that is, a p-type layer is epitaxially grown on the AlGaN barrier layer on the basis of the epitaxial structure of the traditional HEMT so as to form a pn junction in the range of the entire epitaxial wafer, and a space charge region (mainly distributed in the barrier layer and the channel layer) effectively deplete the two-dimensional electron gas (2DEG) at the channel. Because the enhancement-mode HEMT only requires that the electrons under the gategate are depleted, it is needed to etch a non-gate region on the epitaxial wafer in the subsequent chip process, and the depleted two-dimensional electron gas is restored, as shown in FIG. 1.

In the above technical routine based on selective area etching, an active region heterojunction generally adopts an AlGaN/AlN/GaN structure. In order to obtain good device normally-off performance, namely higher forward threshold voltage, typically, the barrier layer cannot have high Al component or thick thickness. However, this simultaneously means that the concentration of the carriers in the channel is reduced, the output characteristics of the device (on-resistance and saturated output current) cannot be optimum. Hence, the structure design of the conventional active region difficultly obtains the joint optimization of the normally-off performance and the output characteristics of the device. In order to solve this problem, researchers prepared the enhancement-mode HEMT based on the p-type gate technology through recessedrecessed gate etching utilizing a regrowth and etching technology, as shown in FIG. 2. This structure can achieve the synchronous optimization of threshold voltages and conduction characteristics because the gategate region has a thin barrier layer and the non-gategate region has a thick barrier layer. However, because its gategate region still adopts a low-Al-component thin-barrier-layer structure, for holes in the p-type layer and electrons in the channel layer, the barrier height is low, and thus increased electric leakage of the forward gate of the device and reduced gate threshold voltage swing are extremely easily caused, the reliability demand of the device in practical work cannot be met. Furthermore, in the recessedrecessed gate preparation process, electrochemical corrosion and slow etching technologies are adopted, so the process is complicated and difficult to control, and is not conductive to large-scale production.

SUMMARY

The main objective of the disclosure is to provide a group III nitride enhancement-mode HEMT based on a composite barrier layer structure and a manufacturing method thereof, in order to overcome the deficiencies of the prior art.

In order to achieve the foregoing objective of the disclosure, the technical solution adopted by the disclosure includes:

The embodiment of the disclosure provides a group III nitride enhancement-mode HEMT based on a composite barrier layer structure, comprising a heterojunction, a third semiconductor having a second conduction type, a source, a drain and a gate; the heterojunction comprising a first semiconductor and a second semiconductor which have a first conduction type, the second semiconductor being arranged on the first semiconductor and having a band gap wider than that of the first semiconductor, a recessed structure being formed at least in the region of the second semiconductor corresponding to the gate, the third semiconductor being at least locally arranged in the recessed structure, the source and the drain being able to be electrically connected through a two-dimensional electron gas formed in the heterojunction, and the gate being arranged between the source and the drain and connected with the third semiconductor; the second semiconductor comprising a first structure layer arranged on the first semiconductor and a second structure layer on the first structure layer, and relative to the selected etching reagent, the first structure layer has higher etching resistance than the second structure layer.

Further, both of the first structure layer and the second structure layer contain Al component.

More further, the content of the Al component in the second structure layer is lower than that in the first structure layer, and the contents of the Al components in the first structure layer and the second structure layer satisfy the following conditions: the selected etching reagent can etch the second structure layer but not the first structure layer.

More further, the selected etching reagent can be an etching gas capable of being applied to a dry etching process, for example a Cl-based etching gas and/or an F-based etching gas, but is not limited thereto.

The embodiment of the disclosure also provides a manufacturing of a group III nitride enhancement-mode HEMT based on a composite barrier layer structure, comprising:

growing an epitaxial layer, the epitaxial layer comprising a first semiconductor and a second semiconductor which are successively formed, and the second semiconductor comprising a first structure layer and a second structure layer which are successively formed;

processing the recessed structure on the epitaxial layer;

growing a third semiconductor or a second semiconductor and the third semiconductor on the epitaxial layer, filling the recessed structure with the third semiconductor or the second semiconductor and the third semiconductor;

removing the third semiconductor located in the non-gate region; and manufacturing a source, a drain and a gate.

More further, the manufacturing method can comprise: processing the recessed structure in the epitaxial layer by adopting a dry etching process.

More further, the etching gases adopted by the dry etching process comprise Cl-based etching gases and/or F-based etching gases, but are not limited thereto, for example, oxygen is also mixed in the etching gases adopted by the dry etching process.

Compared with the prior art, the group III nitride enhancement-mode HEMT of the disclosure adopts the composite barrier layer structure, for example, a high-Al-component barrier layer is located close to the upper part of the channel, a low Al component barrier layer is located above the high Al component barrier layer, etching is performed by utilizing a high selection ratio between high and low Al component barrier layers, and etch stopping is directly formed at the high Al component barrier layer or an insertion layer such as AlN having higher Al component, thereby achieving high-precision recessed gate preparation. Furthermore, the etching process itself is simple, effective and controllable. A back barrier layer having a wider band gap is located under the channel layer, which can improve the threshold voltage. Further, after p-type layer regrowth and non-gate region p-type layer etching are completed in turn, the formed p-type gate region barrier layer can effectively inhibit the electric leakage of the forward gate of the device and improve the gate threshold voltage swing due to its high Al component. At the same time, the thickness of the barrier layer of the p-type gate region is directly determined by epitaxial growth and the thickness is precisely controllable, so the intra-wafer uniformity of the threshold voltage of the device can be guaranteed, and the group III nitride enhancement-mode HEMT of the disclosure is suitable for large-scale production.

DETAILED DESCRIPTION OF THE EMBODIMENTS

Figure 1:
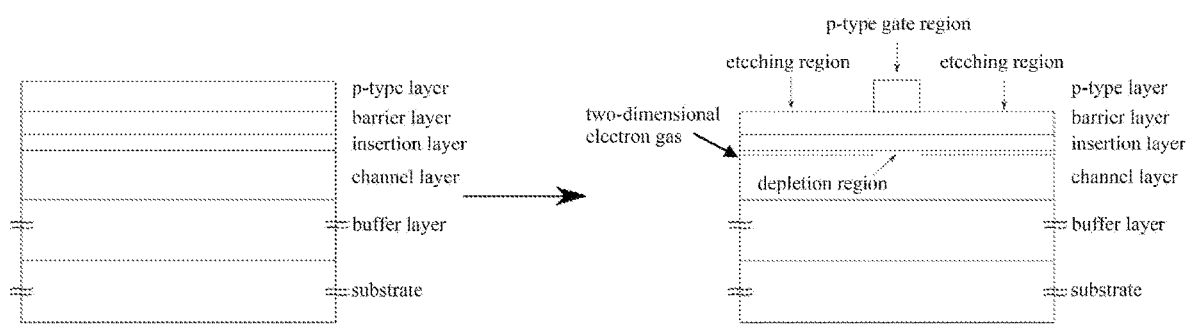
FIG. 1 is a diagram of a p-type gate enhancement-mode HEMT manufactured based on a selective region etching technology in the prior art.
Figure 2:
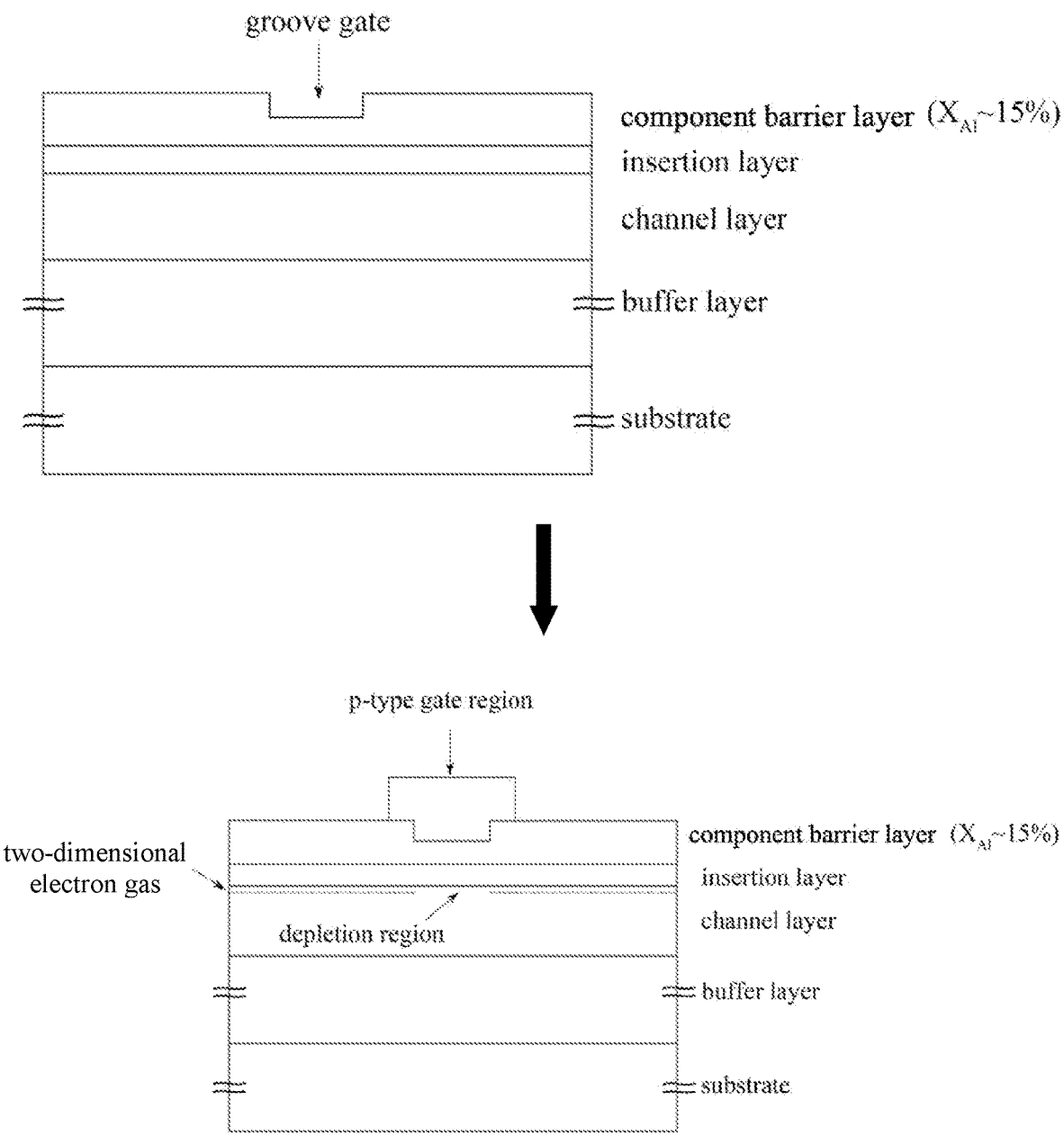
FIG. 2 is a diagram of an enhancement-mode HEMT manufactured by adopting a recessed gate etching and p-type layer regrowth technology in the prior art.
Figure 3:
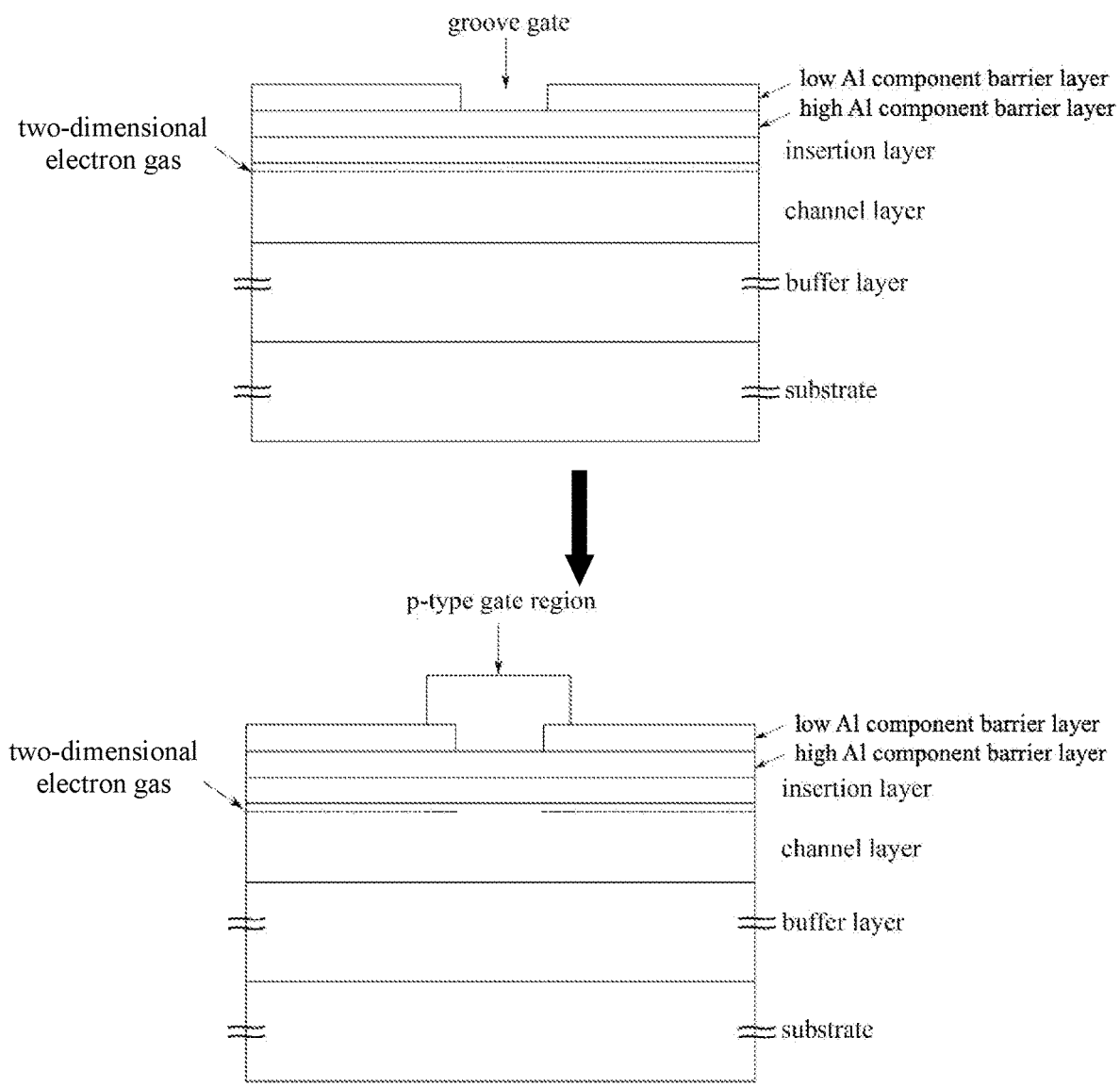
FIG. 3 is a diagram of an enhancement-mode HEMT manufactured based on a composite barrier layer structure in a typical embodiment of the disclosure.

In view of the deficiencies in the prior art, the inventor of this case provides the technical solution of the disclosure through long-term researches and a large amount of practices. Next, the technical solution, implementation process, principle and the like will be further explained and described. However, it should be understood that the above various technical features and various technical features specifically described hereinafter (such as embodiments) can be combined with each other within the scope of the disclosure, thereby constituting new or preferred technical solutions. Due to the limit of space, detailed contents will not be enumerated here for conciseness.

A group III nitride enhancement-mode HEMT based on a composite barrier layer structure provided by one aspect of the embodiment of the disclosure includes a heterojunction, a third semiconductor having a second conduction type, a source, a drain and a gate; the heterojunction comprising a first semiconductor and a second semiconductor which have a first conduction type, the second semiconductor being arranged on the first semiconductor and having a band gap wider than that of the first semiconductor, a recessed structure being formed at least in the region of the second semiconductor corresponding to the gate, the third semiconductor being at least locally arranged in the recessed structure, the source and the drain being able to be electrically connected through a two-dimensional electron gas formed in the heterojunction, and the gate being arranged between the source and the drain and connected with the third semiconductor; wherein, the second semiconductor comprises a first structure layer arranged on the first semiconductor layer and a second structure layer on the first structure layer, and relative to the selected etching reagent, the first structure layer has higher etching resistance than the second structure layer.

Typically, the foregoing first conduction type and second conduction type can be respectively n-type and p-type.

Further, both of the first structure layer and the second structure layer contain Al component.

More further, the content of the Al component in the second structure layer is lower than that in the first structure layer, and the contents of the Al components in the first structure layer and the second structure layer meet the following conditions: the selected etching reagent can etch the second structure layer but not the first structure layer.

More further, the selected etching reagent can be an etching gas capable of being applied to a dry etching process, for example a Cl-based etching gas and/or an F-based etching gas, but is not limited thereto. The typical etching gas can be $Cl_2/N_2/O_2$, other Cl-based oxygen-containing etching mixed gases such as $Cl_2/BCl_3/N_2/O_2$, $BCl_3/N_2/O_2$ and $Cl_2/O_2$, a Cl-based and F-based etching mixed gas such as $Cl_2/BCl_3/SF_6$ and $Cl_2/SF_6$, and a conventional Cl-based etching gas such as $Cl_2$ and $Cl_2/BCl_3$.

In some embodiments, the bottom of the recessed structure is located at an interface between the second structure layer and the first structure layer.

In some embodiments, the bottom of the recessed structure enters the first structure layer.

In some embodiments, the bottom of the recessed structure is located at the upper surface of the first semiconductor or enters the first semiconductor layer.

Further, the first semiconductor, the second semiconductor and the third semiconductor are all selected form group III nitrides.

For example, the first semiconductor can comprise GaN, but is not limited thereto.

For example, the second semiconductor can comprise any one or a combination of more than two of AlGaN, AlInGaN and AlInN, but is not limited thereto.

For example, the third semiconductor can comprise any one or a combination of more than two of p-GaN, p-AlGaN, p-AlInN, p-InGaN and p-AlInGaN, but is not limited thereto.

In some embodiments, an insertion layer is also arranged between the first semiconductor and the second semiconductor.

In some embodiments, an insertion layer is also arranged between the first structure layer and the second structure layer.

Further, the material of the insertion layer comprises AlN, but is not limited thereto.

In some embodiments, the foregoing first semiconductor and second semiconductor can be respectively considered as the channel layer and the barrier layer. The first structure layer and the second structure layer can be respectively considered as a lower barrier layer and an upper carrier layer.

Correspondingly, the foregoing barrier layer can be of double Al component AlGaN composite barrier layer structure, a sandwich type AlGaN barrier layer structure containing an AlN insertion layer, a AlInN-based barrier layer structure, a AlInGaN-based barrier layer structure or a combination thereof, but is not limited thereto.

Further, in some embodiments, on the premise that the barrier layer close to the channel layer has high Al component, the barrier layer Al component can be various functions along the epitaxial growth direction, the Al component in the high Al component barrier layer is not necessarily fixed, and can also be a distribution to regulate and control the structure, stress, 2DEG concentration and the like of the energy band.

In addition, in some embodiments, if the AlN insertion layer is used as a part of the barrier layer, the whole barrier layer is etched and penetrated by using AlN as an etch stopping layer, thereby achieving or entering the channel layer.

In some embodiments, the foregoing third semiconductors can be respectively considered as the p-type layer.

In some foregoing embodiments, the barrier layer is of a composite structure, namely, the high Al component barrier layer is epitaxially grown between the low Al component barrier layer and the channel layer. On the one hand, the gate characteristics of the device can be effectively promoted, including reduction in electric leakage of the forward gate and improvement in gate threshold voltage swing. On the other hand, when the device is manufactured, etching stop is formed at the high Al component barrier layer by using the etching with high selectivity of the low Al component barrier layer over the high Al component barrier layer and, thereby realizing the high-precision recessed gate preparation. Furthermore, the etching process itself is simple, effective and controllable.

Further, the second semiconductor is also provided with a fourth semiconductor, and the third semiconductor penetrates through the fourth semiconductor and enters the recessed structure.

Preferably, the fourth semiconductor comprises GaN, but is not limited thereto.

In some embodiments, the foregoing fourth semiconductors can be respectively considered as cap layers.

In some embodiments, the gate, the third semiconductor and the fourth semiconductor are also covered with passivation layers, and the source and the drain are exposed from the passivation layers.

Preferably, the material of the passivation layer comprises any one or a combination of more than two of silicon nitride, $SiO_2$, $Al_2O_3$ and aluminum nitride, but is not limited thereto.

Further, the gate and the third semiconductor form Schottky contact or ohmic contact.

In some embodiments, the HEMT also comprises a fifth semiconductor having the first conduction type, the first semiconductor is arranged on the fifth semiconductor and forms a heterostructure together with the fifth semiconductor. Preferably, the fifth semiconductor has a band gap wider than that of the first semiconductor.

Further, the fifth semiconductor comprises AlGaN, but is not limited thereto.

In some embodiments, the foregoing fifth semiconductor can be also considered as a back barrier layer which jointly constitutes the channel layer structure together with the foregoing first semiconductor to increase the threshold voltage of the enhancement-mode HEMT.

In some embodiments, the HEMT is a device without a field plate structure or a device with a field plate structure.

In some embodiments, a recessed structure for the source and the drain is formed in the second semiconductor, and the source and the drain together with the second semiconductor form ohmic contact.

In some embodiments, the group III nitride enhancement-mode HEMT further comprises a substrate on which the first semiconductor is formed.

In some embodiments, the group III nitride enhancement-mode HEMT further comprises a substrate and a buffer layer, and the buffer layer and the first semiconductor are successively formed on the substrate.

The foregoing substrate can comprise sapphire, silicon carbide, gallium nitride and aluminum nitride, but is not limited thereto.

The foregoing buffer layer can be GaN buffer layer, a graded Al component AlGaN buffer layer and other materials or a combination of the two, but is not limited thereto.

A manufacturing method of a group III nitride enhancement-mode HEMT based on a composite barrier layer structure provided by another aspect of the embodiment of the disclosure comprises:

growing an epitaxial layer, the epitaxial layer comprising a first semiconductor and a second semiconductor which are successively formed, and the second semiconductor comprising a first structure layer and a second structure layer which are successively formed;

processing the recessed structure on the epitaxial layer;

growing a third semiconductor or a second semiconductor and the third semiconductor on the epitaxial layer, filling the recessed structure with the third semiconductor or the second semiconductor and the third semiconductor;

removing the third semiconductor located in the non-gate region; and manufacturing a source, a drain and a gate.

In some embodiments, the manufacturing method further comprises: growing the first semiconductor, the second semiconductor and the fourth semiconductor on the substrate so as to form the epitaxial layer.

Further, the manufacturing method further comprises: growing a buffer layer, the first semiconductor, the second semiconductor and the fourth semiconductor on the substrate so as to form the epitaxial layer.

In some embodiments, the manufacturing method further comprises:

manufacturing a gate on the third semiconductor remained in the region under the gate;

forming passivation layers on the gate, the third semiconductor and the forth semiconductor;

processing windows corresponding to the source and the drain on the passivation layers; and processing recessed structures in the source and drain contact regions of the second semiconductor from the windows, and then manufacturing the source and the drain which form ohmic contact with the second semiconductor.

In some embodiments, the manufacturing method further comprises: processing the recessed structure in the epitaxial layer by adopting the dry etching process.

Preferably, the etching gas adopted by the dry etching process can be the foregoing Cl-based etching gas and/or F-based etching gas, but is not limited thereto.

Further, the foregoing third semiconductor can be regrown and formed by utilizing processes including but not limited to MOCVD, MBE (Molecular Beam Epitaxy). In addition, the foregoing third semiconductor can be doped with magnesium and other elements, the doping concentration can be single doping concentration or a function in the epitaxial growth direction, but is not limited thereto.

In some embodiments, the manufacturing method can comprise: forming a passivation layer using a deposition technology, wherein the deposition technology can be selected from but not limited to PECVD, LPCVD (Low Pressure Chemical Vapor Deposition), ALD (Atom Layer Deposition) and PEALD (Plasma Enhanced Chemical Vapor Deposition).

Further, the metals forming the foregoing gate can be TiN, W, Ni/Au, Pd/Au and other Schottky or ohmic contact gate metals, but are not limited thereto.

In some embodiments, the foregoing gate can be directly prepared by using a self-aligned technology or other technologies.

In some embodiments, the source, the drain and the like can be manufactured, and then the gate is manufactured.

In some embodiments, the foregoing ohmic contact is formed by using a high-temperature ohmic contact preparation process or a low-temperature ohmic contact preparation process or the like.

In some preferred embodiments, the manufacturing method can comprise: the composite barrier layer structure is adopted, that is, the high Al component barrier layer is epitaxially grown between the low Al component barrier layer and the channel layer, so as to not only effectively improve the gate characteristics of the device, including reduction in electric leakage of the forward gate and increase in gate threshold voltage swing, but also direct from etch stopping at the high Al component barrier layer by only using the dry etching technology and utilizing selective etching between different Al component barrier layers so as to precisely manufacture the recessed gate structure, and further form a recessed p-type gate structure through the p-type regrowth and etching technology. In such a way, on the one hand, the process difficulty can be greatly reduced, and the process stability can be improved; on the other hand, the thickness of the barrier layer in the p-type gate region is directly determined by epitaxial growth, and the thickness is precisely controllable, so as to significantly promote the uniformity of the threshold voltage of the device.

The technical solution of the disclosure will be described in more detail in combination with several embodiments.

Figure 4:
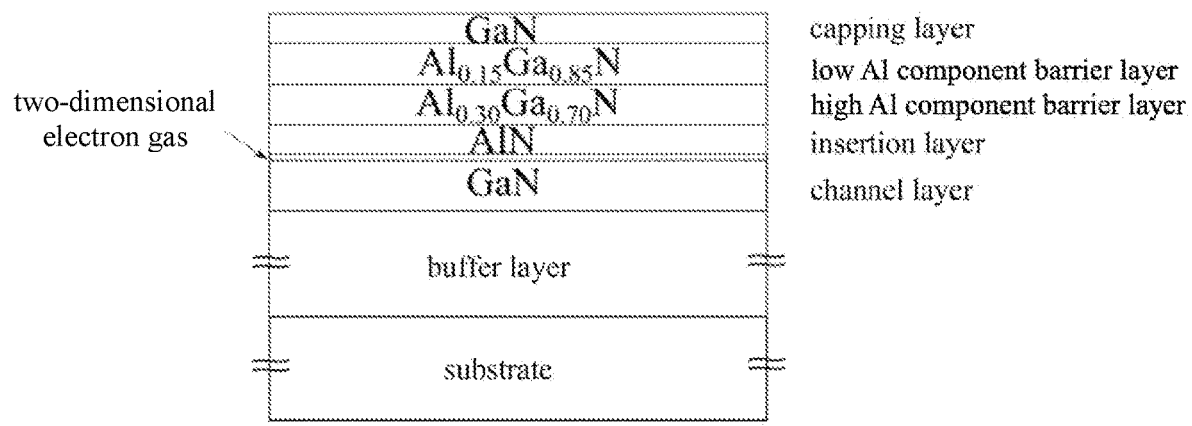
FIG. 4 is a diagram of an HEMT epitaxial structure based on an AlGaN double barrier layer heterojunction in embodiment 1 of the disclosure.

Embodiment 1 A manufacturing method of HEMT based on a $Al_{0.15}Ga_{0.85}N/Al_{0.30}Ga_{0.70}N$ double barrier layer comprises the following steps:

Step S1: MOCVD epitaxial growth of HEMT based on an AlGaN double barrier layer heterojunction, wherein the upper barrier layer is the low Al component AlGaN barrier layer, the Al component is 15%, and the thickness is 20~35 nm; the lower barrier layer is the high Al component AlGaN barrier layer, the Al component is 30%, and the thickness is 5~10 nm. The AlN insertion layer is about 1 nm; and the GaN channel layer is 50~200 nm. The HEMT epitaxial structure is shown in FIG. 4. The buffer layer can be a GaN buffer layer or a graded Al component AlGaN buffer layer or a combination of the two; the substrate can be sapphire, silicon carbide, gallium nitride, aluminum nitride or the like.

Figure 5:
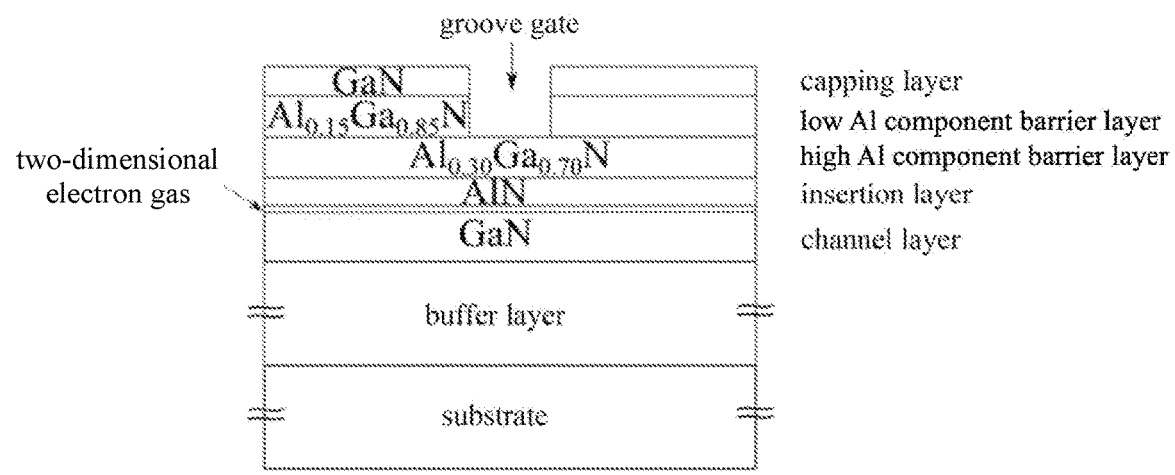
FIG. 5 is a diagram after the device structure shown in FIG. 4 is subjected to recessed gate etching by using an oxygen-containing ICP technology.

Step S2: recessed gate etching. Recessed gate etching is performed by serving the AZ5214 photoresist as a mask and using an inductively coupled plasma (ICP) etching technology. The etching mixed gas is chlorine/oxygen/nitrogen. By adjusting the flow and the flow ratio (chlorine flow 10-100 sccm, oxygen flow is 5%~80% of chlorine flow, nitrogen flow is 15%-75% of chlorine flow) of the etching mixed gas, etching cavity pressure (10-100 mTorr), RF power (10-100 w) and ICP power (300-2500 W), etch stopping is directly formed on the high Al component barrier later $Al_{0.30}Ga_{0.70}N$ on the basis that the low Al component barrier layer $Al_{0.15}Ga_{0.85}N$ can be etched. The (Al, Ga) $O_x$ etching-resistant layer formed on the etched surface is removed with acid solution. The formed device structure is as shown in FIG. 5.

Figure 6:
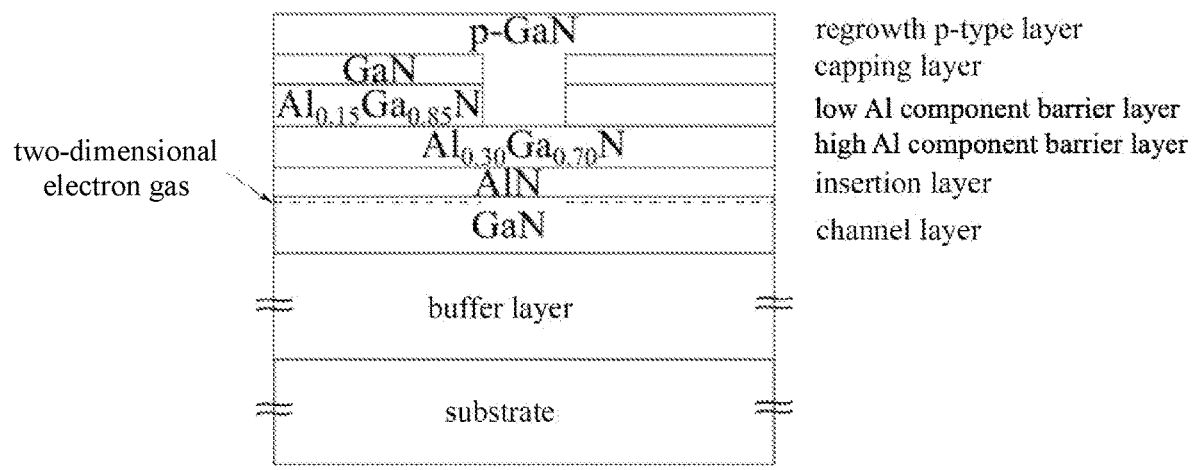
FIG. 6 is a diagram after p-type layer regrowth is performed on the device structure shown in FIG. 5.

Step S3: regrowth of p-type layer. MOCVD epitaxial growth of the p-type layer is performed, the p-GaN thickness is 5-300 nm, and the range of Mg doping concentration is the $10^{18}$-$10^{21}$/cm³ order. The formed device structure is shown in FIG. 6.

Figure 7:
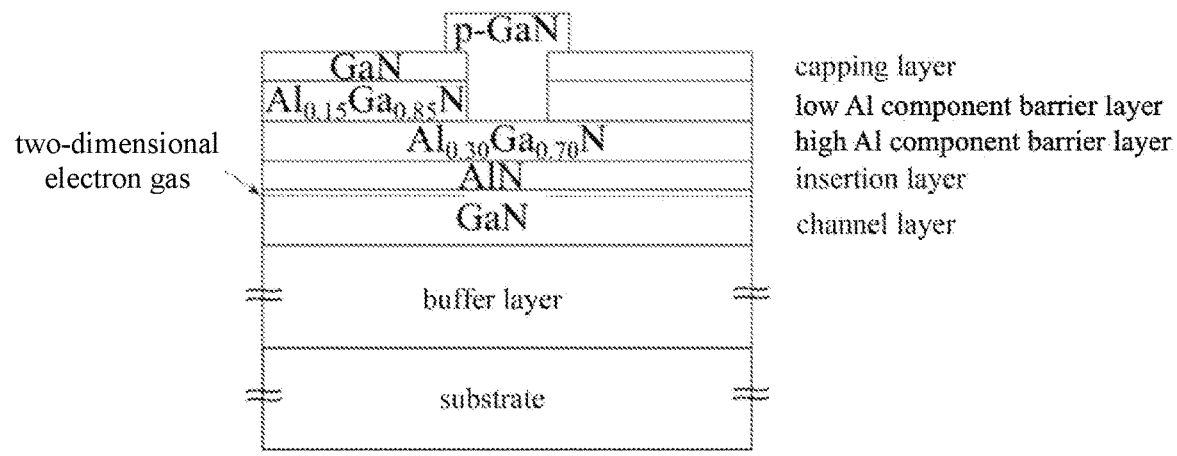
FIG. 7 is a diagram after the p-type layer in the non-gate region of the device structure shown in FIG. 6 is etched.

Step S4: etching of the p-type layer in a non-gate region. The p-type layer in the non-gate region is etched by the ICP etching technology. The formed device structure is shown in FIG. 7.

Figure 8:
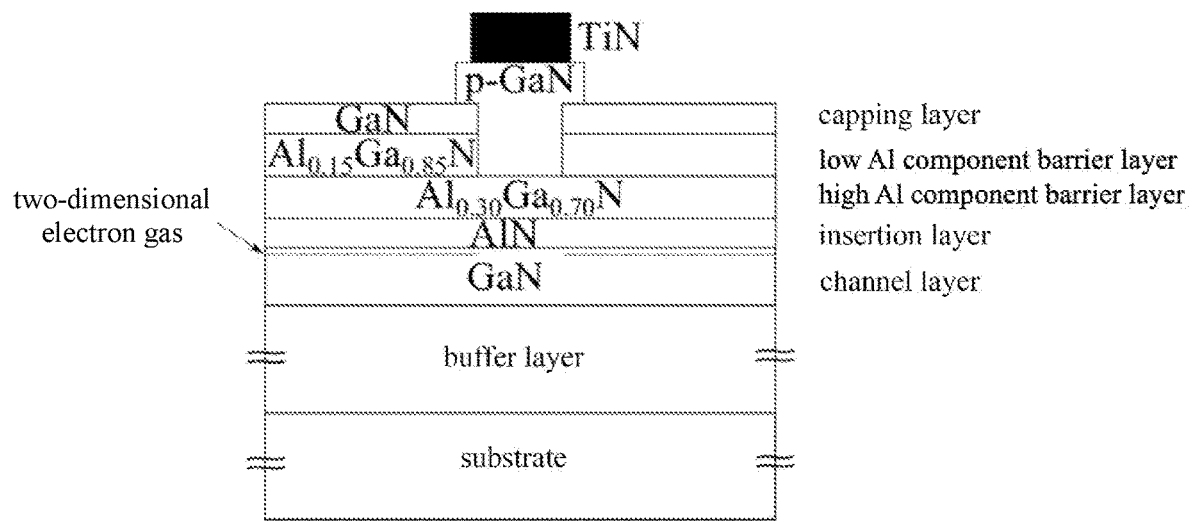
FIG. 8 is a diagram after a gate metal is deposited on the p-type layer of the device structure shown in FIG. 7.

Step S5: deposition of gate metal. TiN deposition is performed by magnetron sputtering, and the thickness is 50-200 nm. The formed device structure is shown in FIG. 8.

Figure 9:
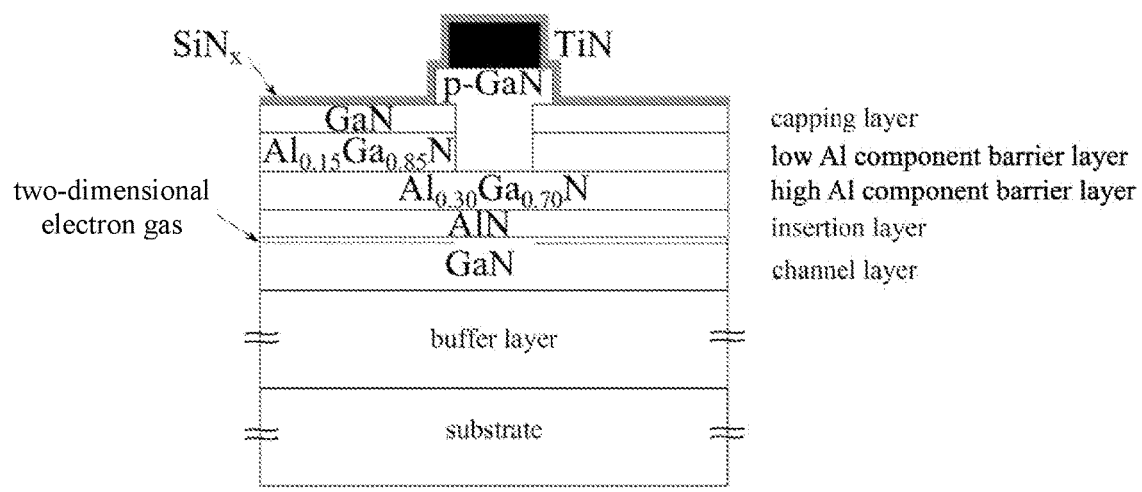
FIG. 9 is a diagram after a silicon nitride passivation layer is deposited on the device structure shown in FIG. 8.

Step S6: deposition of passivation layers. The SiNx passivation layer is deposited by the PECVD dielectric layer deposition technology, and the thickness is 10~500 nm. The formed device structure is shown in FIG. 9.

Figure 10:
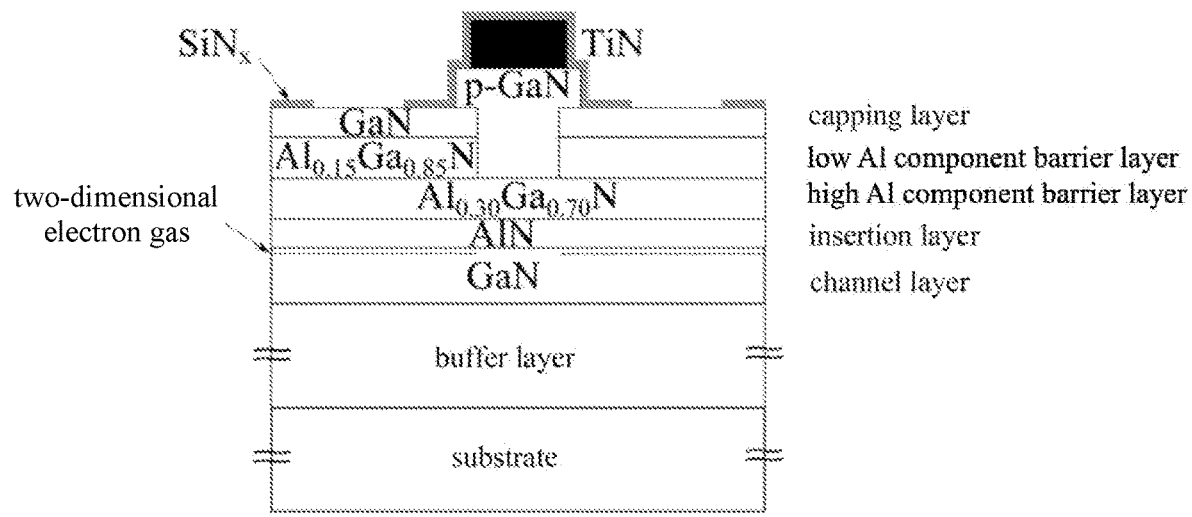
FIG. 10 is a diagram after the ohmic contact region of the device structure shown in FIG. 9 is windowed.

Step S7: windowing of passivation layers. SiNx is etched through RIE (reactive ion etch) to achieve ohmic contact windowing. The formed device structure is shown in FIG. 10.

Figure 11:
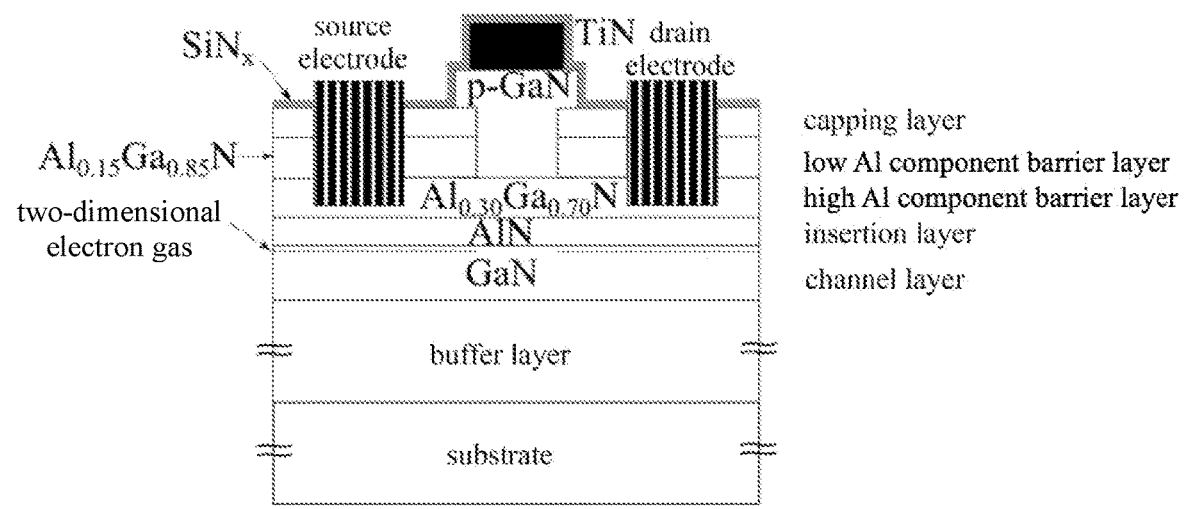
FIG. 11 is a diagram after source and drain ohmic contact is manufactured on the device structure shown in FIG. 10.

Step S8: source and drain ohmic contact. Preparation conditions: after recessed etching of source and drain contact region is performed, metals Ti/Al/Ni/Au are deposited, the thicknesses are 20 nm/130 nm/50 nm/150 nm, and the annealing conditions: 890° C., 30 s and nitrogen atmosphere. The formed device structure formed is shown in FIG. 11.

Figure 12:
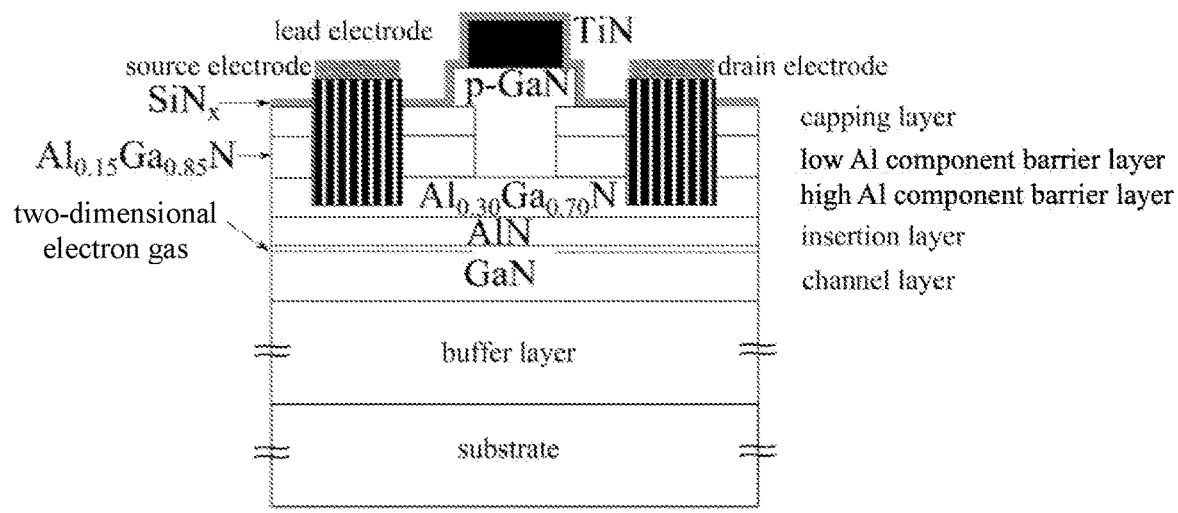
FIG. 12 is a diagram after a lead electrode is manufactured on the device structure shown in FIG. 11.

Step S9: lead electrode. Preparation conditions: Metal Ni/Au, the thicknesses are 50 nm/400 nm. The formed device structure is shown in FIG. 12.

Figure 13:
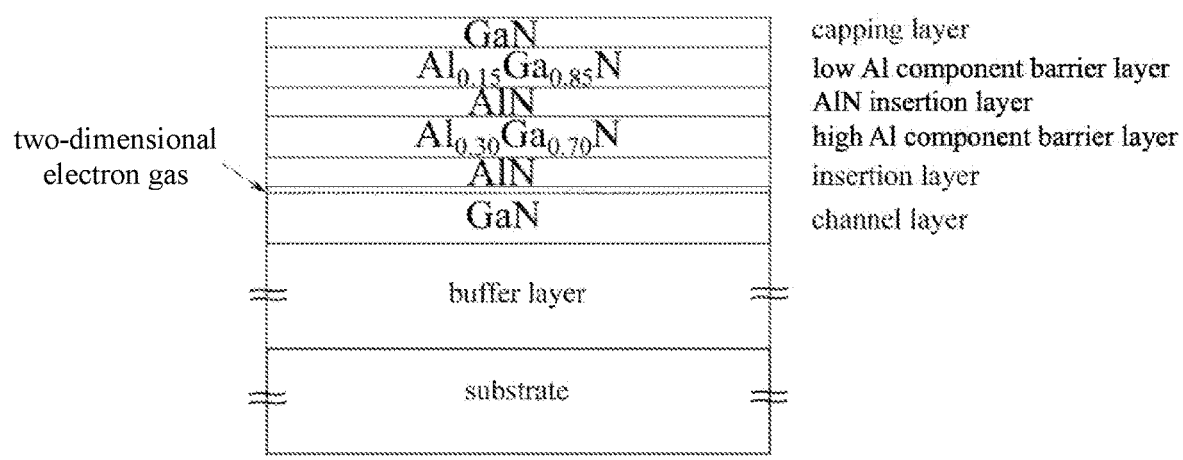
FIG. 13 is a diagram of an HEMT epitaxial structure based on an AlGaN multi-barrier layer heterojunction in the embodiment 2 of the disclosure.

Embodiment 2 A manufacturing method of HEMT based on $Al_{0.15}Ga_{0.85}N/Al_{0.30}Ga_{0.70}N$ double barrier layer comprises the following steps:

Step S1: MOCVD epitaxial growth of HEMT based on an AlGaN double barrier layer heterojunction, namely, a sandwich type AlGaN barrier layer structure containing an AlN insertion layer is adopted: the upper barrier layer is the low Al component AlGaN barrier layer, the Al component is 15%, and the thickness is 20~35 nm; the lower barrier layer is the high Al component AlGaN barrier layer, the Al component is 30%, and the thickness is 5~10 nm; the insertion layer, with a thickness of about 1~2 nm, is between the upper barrier layer and the lower barrier layer, the function of this layer is to provide a wider process window for self-stopping etching so that the recessed gate etching process is more stable and reliable. In addition, the AlN insertion layer is about 1 nm; the GaN channel layer is 50~200 nm. The HEMT epitaxial structure is shown in FIG. 13. Wherein, the buffer layer can be the GaN buffer layer or the graded Al component AlGaN buffer layer or a combination of the two; the substrate can be sapphire, silicon carbide, gallium nitride, aluminum nitride or the like.

Figure 14:
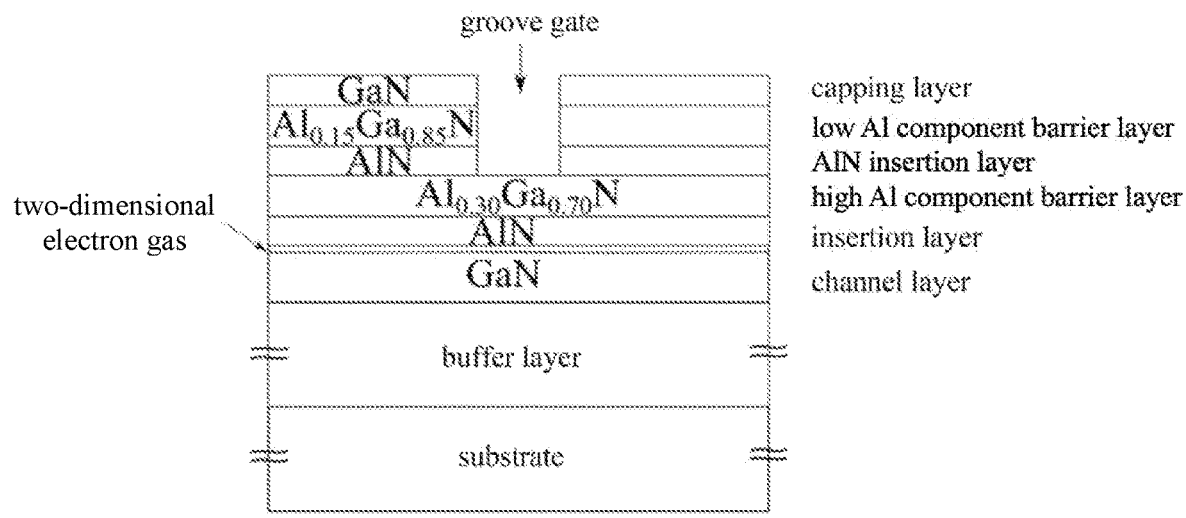
FIG. 14 is a diagram after recessed gate etching is performed on the device structure shown in FIG. 13 by using an oxygen-containing ICP technology.

Step S2: recessed gate etching. An AZ5214 photoresist was used as a mask, inductively coupled plasma (ICP) etching technology was used for recessed gate etching is performed by serving the AZ5214 photoresist as a mask and using an inductively coupled plasma (ICP) etching technology. The etching mixed gas is chlorine/oxygen/nitrogen. By adjusting the flow and the flow ratio (chlorine flow 10~100 sccm, oxygen flow is 5%~70% of chlorine flow, nitrogen flow is 15%~75% of chlorine flow) of the etching mixed gas, etching cavity pressure (10~100 mTorr), RF power (10~200 W), ICP power (300-2500 W), etch stopping is directly formed on AlN on the basis that the low Al component barrier layer $Al_{0.15}Ga_{0.85}N$ can be etched. The (Al, Ga) $O_x$ etching-resistant layer formed on the etched surface is removed with acid solution. The formed device structure is as shown in FIG. 14.

Figure 15:
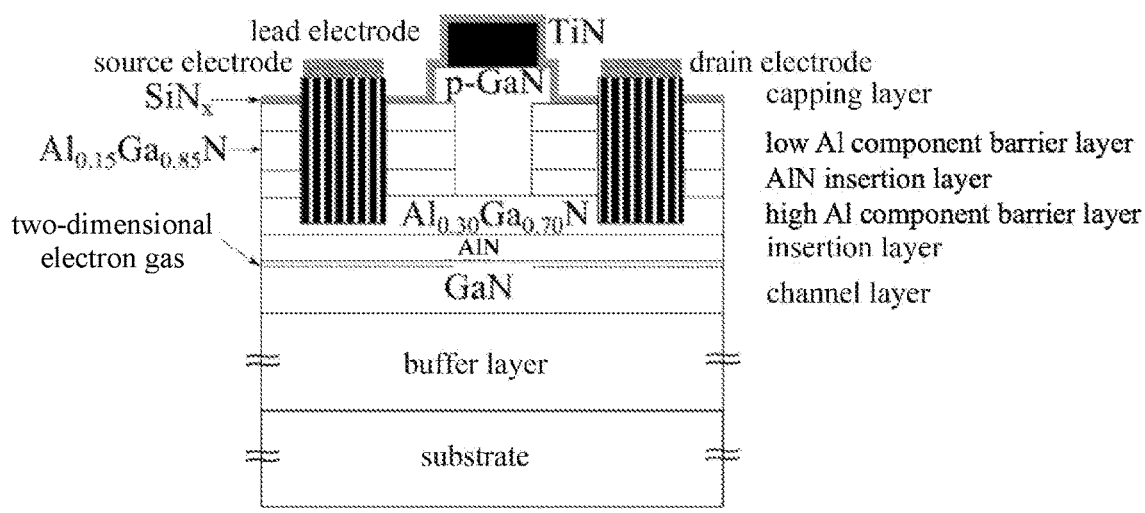
FIG. 15 is a structural diagram of an HEMT finished product based on an AlGaN multi-barrier layer heterojunction in the embodiment 2 of the disclosure.

Steps S3~S9: the steps are similar to steps S3~S9 in example 1. The device after completing the whole chip process is shown in FIG. 15.

In addition, the double Al component AlGaN composite barrier layer structure, a sandwich type AlGaN barrier layer structure containing the AlN insertion layer and the like in the aforementioned embodiments can also be replaced as other barrier layer structures, such as a AlInN-based barrier layer, a AlInGaN-based barrier layer or a combination thereof.

The etching gas in the aforementioned embodiments can also be replaced as Cl-based and F-based etching gases, such as $Cl_2/BCl_3/N_2/O_2$, $BCl_3/N_2/O_2$, $Cl_2/O_2$, $Cl_2/BCl_3/SF_6$, $Cl_2/SF_6$, $Cl_2$, $Cl_2/BCl_3$, or a combination thereof.

The p-GaN layer in the aforementioned embodiments can also be replaced as other p-type layers such as p-AlGaN, p-AlInN, p-InGan, p-AlInGan or composite structures thereof, and can also be formed by MBE and other processes.

In the aforementioned embodiments, the material of the passivation layer can also be replaced as silicon oxide, aluminum oxide, aluminum nitride and the like, and the corresponding deposition technologies can also be LPCVD, ALD, PEALD and the like.

The p-type gate in the aforementioned embodiments can also be directly prepared by using self-aligned technology and the like.

In the aforementioned embodiments, the manufacturing sequence of the source, the drain and the gate can also be adjusted according to actual demands, for example, the source and the drain can be manufactured, and then the gate can be manufactured.

The gate metal in the aforementioned embodiments can also be replaced as other metal materials, such as W, Ni/Au, Pd/Au and other Schottky or ohmic contact metals.

In addition, the device without the field plate structure in the aforementioned embodiments can also be adjusted and manufactured into the device with the field plate structure.

The HEMT devices formed by the above alternative solutions also have extremely excellent performances.

In summary, in the aforementioned embodiments of the disclosure, the etch stopping is directly formed at the high Al component barrier layer or the AlN insertion layer with the higher Al component by utilizing high selective ratio etching between high and low Al component barrier layers due to adoption of the composite barrier layer structure, so as to realize high-precision recessed gate preparation. Furthermore, the etching process itself is simple, effective and controllable. The back barrier layer having the wider band gap is present under the channel layer so as to improve the threshold voltage of the device. Further, after the regrowth of the p-type layer and the etching of the p-type layer in the non-gate region are completed, the formed p-type region barrier layer can effectively inhibit the electric leakage of the forward gate of the device and improve the gate threshold voltage swing due to its high Al component. Meanwhile, the thickness of the p-type gate region barrier layer is directly determined by epitaxial growth, and the thickness is precisely controllable, so the intra-wafer uniformity of the threshold voltage of the device can be guaranteed. The disclosure is suitable for large-scale production.

It should be understood that the above embodiments are only for illustrating the technical concept and features of the disclosure for the purpose of allowing people familiar with the technology to understand the content of the disclosure and implement the disclosure, but cannot whereby limit the protective scope of the disclosure. Any equivalent changes or modifications made according to the spirits and essences of the disclosure shall be included in the protective scope of the disclosure.

What is claimed is:

1. A group Ill nitride enhancement-mode high electron mobility transistor, comprising a heterojunction, a source, a drain and a gate;

wherein the heterojunction comprises a first semiconductor and a second semiconductor, and the group III nitride enhancement-mode high electron mobility transistor further comprises a third semiconductor, wherein the second semiconductor is formed on top of the first semiconductor, the third semiconductor is formed on top of the second semiconductor, the first semiconductor and the second semiconductor each has a first conduction type, and the third semiconductor has a second conduction type;

wherein the second semiconductor is arranged on the first semiconductor and has a band gap wider than a band gap of the first semiconductor, a recessed structure is formed in a region of the second semiconductor corresponding to the gate, the third semiconductor is arranged in the recessed structure, a two-dimensional electron gas is formed at a top surface of the first semiconductor, and the gate is arranged between the source and the drain and connected with the third semiconductor;

wherein the second semiconductor is an Al composite barrier layer structure selected from the group consisting of an AlGaN composite barrier layer structure, an AlInN-based barrier layer structure, and an AlInGaN-based barrier layer structure, and the Al composite barrier layer structure comprises a first structure layer arranged on the first semiconductor and a second structure layer on the first structure layer;

wherein each of the first structure layer and the second structure layer contains an Al component, and a content ratio of the Al component in the second structure layer is lower than the content ratio of the Al component in the first structure layer, wherein the content ratio of the Al component is a ratio of Al to metals of Group III elements in the second semiconductor;

wherein the second semiconductor is formed with recessed grooves respectively matched with the source and the drain, wherein the source and the drain form ohmic contact with the second semiconductor, wherein the ratio of the Al component in the first structure layer to a Ga component in the first structure layer is 0.3:0.70 and the ratio of the Al component in the second structure layer to a Ga component in the second structure layer is 0.15:0.85.

2. The group III nitride enhancement-mode high electron mobility transistor according to claim 1, wherein a recessed bottom of the recessed structure is located at an interface between the second structure layer and the first structure layer, or the recessed bottom of the recessed structure enters the first structure layer, or the recessed bottom of the recessed structure is aligned with an upper end surface of the first semiconductor, or the recessed bottom of the recessed structure enters the first semiconductor.

3. The group III nitride enhancement-mode high electron mobility transistor according to claim 1, wherein the first semiconductor, the second semiconductor and the third semiconductor are each selected from group III nitrides.

4. The group III nitride enhancement-mode high electron mobility transistor according to claim 3, wherein the first semiconductor comprises GaN, and the third semiconductor is at least one selected from the group consisting of p-GaN, p-AlGaN, p-AlInN, p-InGaN and p-AlInGaN.

5. The group III nitride enhancement-mode high electron mobility transistor according to claim 1, further comprising an insertion layer,
wherein the insertion layer is arranged between the first semiconductor and the second semiconductor, or the insertion layer is arranged between the first structure layer and the second structure layer; and a material of the insertion layer comprises AlN.

6. The group III nitride enhancement-mode high electron mobility transistor according to claim 1, wherein the second semiconductor is further provided with a fourth semiconductor, and the third semiconductor penetrates through the fourth semiconductor and enters the recessed structure, and/or the group III nitride enhancement-mode high electron mobility transistor further comprises a fifth semiconductor having the first conduction type, the first semiconductor is arranged on the fifth semiconductor and forms a heterostructure with the fifth semiconductor, and the fifth semiconductor has a wider band gap than the first semiconductor.

7. The group III nitride enhancement-mode high electron mobility transistor according to claim 6, wherein the fourth semiconductor comprises GaN, or the fifth semiconductor comprises AlGaN.

8. The group III nitride enhancement-mode high electron mobility transistor according to claim 6, wherein the gate, the third semiconductor and the fourth semiconductor are further covered with passivation layers, and the source and the drain are exposed from the passivation layers; and a material of the passivation layers is at least one selected from the group consisting of $Si_3N_4$, $SiO_2$, $Al_2O_3$ and AlN.

* * * * *